(12) United States Patent
Fasano et al.

(10) Patent No.: US 9,673,177 B1
(45) Date of Patent: Jun. 6, 2017

(54) SELECTIVELY SOLUBLE STANDOFFS FOR CHIP JOINING

(71) Applicant: INTERNATIONAL BUSINESS MACHINES CORPORATION, Armonk, NY (US)

(72) Inventors: Benjamin V. Fasano, New Windsor, NY (US); Mark W. Kapfhammer, Poughkeepsie, NY (US); David J. Lewison, Wappingers Falls, NY (US); Thomas E. Lombardi, Poughkeepsie, NY (US); Thomas Weiss, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 14 days.

(21) Appl. No.: 14/969,905

(22) Filed: Dec. 15, 2015

(51) Int. Cl.
*H01L 23/31* (2006.01)
*H01L 25/065* (2006.01)
*H01L 25/00* (2006.01)

(52) U.S. Cl.
CPC .......... *H01L 25/0657* (2013.01); *H01L 25/50* (2013.01); *H01L 2225/06513* (2013.01)

(58) Field of Classification Search
CPC ........ H01L 23/13; H01L 23/31; H01L 23/525
See application file for complete search history.

(56) References Cited

U.S. PATENT DOCUMENTS

| 5,767,580 A | 6/1998 | Rostoker |
| 8,373,275 B2 | 2/2013 | Daubenspeck et al. |
| 8,828,860 B2 | 9/2014 | Gruber et al. |
| 8,987,132 B2 | 3/2015 | Gruber et al. |
| 9,095,081 B1 | 7/2015 | Gruber et al. |
| 2002/0046856 A1* | 4/2002 | Alcoe .................. H05K 3/3436 174/534 |
| 2013/0285242 A1 | 10/2013 | Watts et al. |
| 2015/0194408 A1 | 7/2015 | Gruber et al. |

FOREIGN PATENT DOCUMENTS

JP   WO2009063570 A1   5/2009

OTHER PUBLICATIONS

Miller, LF et al. "Semiconductor Chip Joining," IP.com, IP.com No. 000093537; Oct. 1, 1967, pp. 1-2.

\* cited by examiner

*Primary Examiner* — Julia Slutsker
*Assistant Examiner* — Krista Soderholm
(74) *Attorney, Agent, or Firm* — Cantor Colburn LLP; Bryan Bortnick (57) ABSTRACT

A technique relates to forming a chip assembly. Top and bottom chip stack elements containing solder pads and a solder material are provided. Soluble standoffs are applied to the bottom chip stack element. The chip stack elements are aligned to bring the top solder pad in proximity to the bottom solder pad and the temperature is raised to a temperature above the melting temperature of the solder material to form a connected chip assembly. The connected chip assembly is cooled to re-solidify the solder material and soluble standoffs are removed from the connected chip assembly.

19 Claims, 6 Drawing Sheets

SELECTIVELY SOLUBLE STANDOFFS FOR CHIP JOINING

BACKGROUND

The present invention generally relates to semiconductor chip assembly, and more specifically, to selectively soluble standoffs for semiconductor chip joining.

Solder pads can be used in the micro-electronics industry to make electrical and mechanical contacts or connections between integrated circuits (ICs) or between printed circuit boards (PCBs). Solder pads can also be used to make electrical and mechanical contacts or connections between optoelectronic and integrated photonic circuits and components.

To achieve such electrical and mechanical contacts and connections, the surfaces of two or more circuits to be connected can be coated with metal pads or pillars formed of one or more metals or metal films, such as titanium, nickel, copper, platinum, and/or gold, and also sometimes called Under-Bump Metallization pads (UBM pads).

Solder materials, such as tin, silver, gold, bismuth, indium or lead, can then be deposited on some of the metal pads on the substrate, using, for instance, electroplating to form a plated substrate. The surfaces of two circuits to be connected can thereafter be brought into close proximity or contact and then temperature can be temporarily elevated beyond the melting temperature of the solder material. When the solder materials are heated beyond the melting temperature, the melted solder can ball-up to minimize surface tension, contact a solder pad that is in close vertical proximity, wick this proximate or other adjacent solder pad and establish electrical contacts between the two circuits in close contact. Upon cooling, the solder can solidify to mechanically and electrically connect the two circuits.

SUMMARY

According to an embodiment of the present invention, a method of assembling a chip system includes providing a top chip stack element having two major surfaces, the top chip stack element comprising a top solder pad on a plane of a first top surface. The method also includes providing a bottom chip stack element having two major surfaces, the bottom chip stack element comprising a bottom solder pad on a plane of a first bottom surface. The method also includes providing a solder material on one or more of the top solder pad and the bottom solder pad. The method also includes applying spherical soluble standoffs to the plane of the first bottom surface. The method also includes pre-aligning the first chip stack element and the second chip stack element to bring the top solder pad in proximity to the bottom solder pad to form a pre-melt chip assembly. The method also includes raising the temperature to a temperature above the melting temperature of the solder material to form a connected chip assembly. The method also includes cooling the connected chip assembly to re-solidify the solder material and removing the spherical soluble standoffs from the connected chip assembly.

According to another embodiment, a method of assembling a chip system includes providing a top chip stack element having a top solder pad on a plane of a first top surface. The method also includes providing a bottom chip stack element having a bottom solder pad on a plane of a first bottom surface. The method also includes providing a solder material on one or more of the top solder pad and the bottom solder pad. The method also includes applying composite coated particles to the plane of the first bottom surface, the composite coated particles comprising a metal core. The method also includes pre-aligning the first chip stack element and the second chip stack element to bring the first solder pad in proximity to the plated solder pad forming a pre-melt chip assembly. The method also includes compressing the pre-melt chip assembly with a force. The method also includes forming a connected chip assembly. The method also includes re-solidifying the solder material and removing the composite coated particles from the connected chip assembly.

According to yet another embodiment, a chip assembly includes a top chip stack element having two major surfaces, the top chip stack element comprising a top solder pad on a plane of a first top surface. The chip assembly also includes a bottom chip stack element having two major surfaces, the bottom chip stack element comprising a bottom solder pad on a plane of a first bottom surface. The chip assembly also includes a solder material. The chip assembly also includes a composition comprising a flux material and a soluble standoff.

BRIEF DESCRIPTION OF THE DRAWINGS

FIGS. 1A-D illustrate exemplary solder defects in semiconductor chip joining, in which:

FIGS. 3A-3F illustrates a method of assembling a multi-chip system according to another exemplary embodiment, in which:

FIGS. 4A-C illustrate soluble standoffs according to various embodiments of the disclosure, in which

DETAILED DESCRIPTION

Defects sometimes result during the chip joining process affecting the behavior and integrity of contacts between two circuits. Many applications using solder pads and solder involve a very large number of potential solder connections and have a relatively small area on the chip between the solder connections. Adjusting the amount and uniformity of the solder on a large array of solder pads can be a challenging task. For example, variations in solder volume or component warpage can potentially result in an incomplete or fragile connection between two contacts, potentially resulting in a system failure due to an electrical open or formation of cracks. In some cases, for example, if too much solder is used at a particular location, additional solder could result in bulges in the solder bumps and spurious contacts between adjacent solder bumps, potentially resulting in a failure due to an electrical short.

In some cases, the joined height of the solder contacts can be controlled to be uniform and to allow complete wetting of all contacts, for example, with permanent standoffs provided in portions of the chip assembly. With permanent standoffs, a chip stack can be compressed with a force to control uniformity of height during joining. However, such permanent standoffs can adversely impact subsequent processing, for instance by affecting the flow of underfill under and between solder contacts. Removal of such permanent standoffs prior to subsequent processing, on the other hand, can be complex and costly. A cost effective and less complex method to join chip surfaces while minimizing defects is desirable.

As stated above, the present disclosure relates to semiconductor chip assembly, and more specifically, to selectively soluble standoffs for semiconductor chip joining. In some embodiments, the present disclosure relates to non-wettable, selectively soluble standoffs for controlling spacing during chip joining in semiconductor applications.

In conventional chip joining, defects can be created due to a variety of factors, including component warpage and solder volume variability. For example, an incomplete or fragile connection between two contacts can result from warpage or a relatively low solder volume, potentially shown in a system failure due to an electrical open or formation of cracks. In some cases, for example, if too much solder is used at a particular location, additional solder could result in bulges in the solder in the vertical plane, potentially resulting in spurious contacts between adjacent solder bumps and failure due to an electrical short.

Figure 1A:
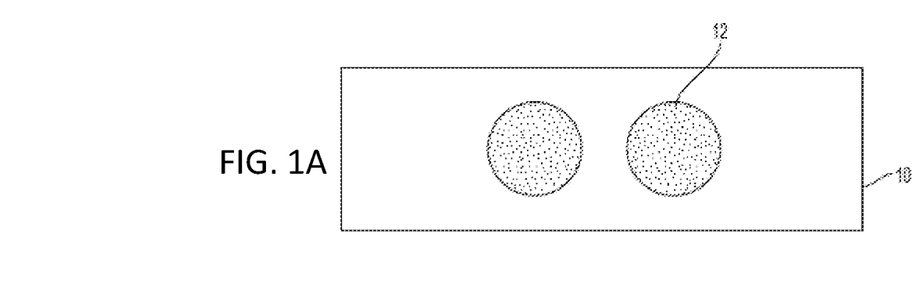
FIG. 1A is a top view of a portion of a bottom chip stack element.
Figure 1B:
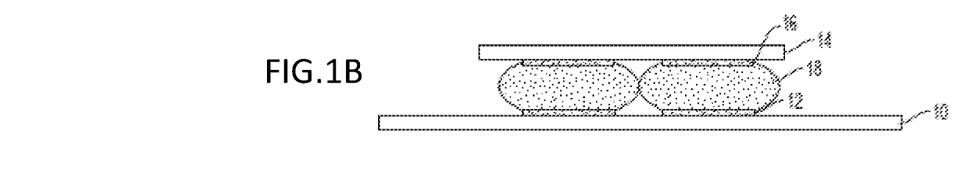
FIG. 1B is a side view of a portion of a chip assembly depicting solder contacts between adjacent solder bumps that could result in an electrical short.

FIGS. 1A-1D depict a portion of a conventional multi-chip assembly illustrating exemplary solder defects after chip joining. FIG. 1A illustrates a top view of a portion of a bottom chip stack element. As shown in FIG. 1A, a bottom solder pad 12 is plated or deposited onto a substrate or bottom chip stack element 10. FIG. 1B depicts a side view of a portion of a conventional chip assembly containing a bottom chip stack element 10 with bottom solder pad 12, a top chip stack element 14 having a top solder pad 16, and solder 18 between the top solder pad 16 and bottom solder pad 12 that forms a mechanical and electrical connection between the top chip stack element 14 and the bottom chip stack element 10.

Prior to or during assembly, or in packaging applications, solder material 18 can be deposited on either the top chip stack element 14 or the bottom chip stack element 10. When the top 14 and bottom 10 are brought into proximity through pre-alignment, solder can be melted and re-solidified, for example by raising the temperature of the assembly above the temperature of the solder in an oven and then cooling the assembly. During the melting process, solder on the bottom solder pad 12, or alternatively the top solder pad 18, wets the solder pads of both substrate and chip and can form bonds with both of the bottom solder pad 12 and the top solder pad 16. To correct for chip warpage or variability of solder material during plating, force can be applied to one of the chip stack elements during solder melting and cooling.

Figure 1C:
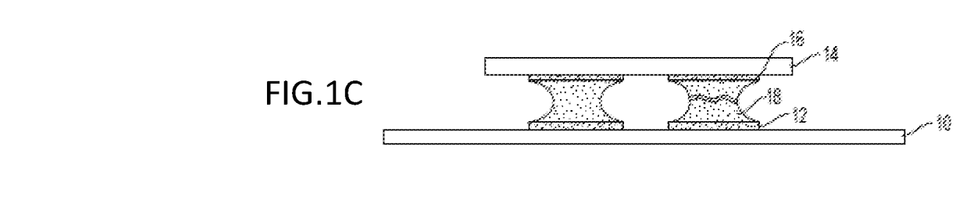
FIG. 1C is a side view of a portion of a chip assembly depicting a cracked solder contact that could result in an electrical open.
Figure 1D:
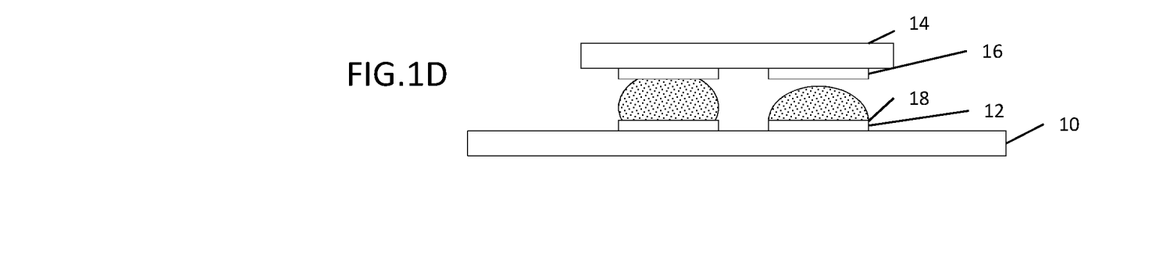
FIG. 1D is a side view of a portion of a chip assembly depicting defects due to nonwetting.

Soldering applications can be sensitive to the amount of solder plated at each connection site and the force applied to the assembly during chip joining, such that too much or too little force or solder at any one site can result in failure of the entire assembly. FIG. 1B depicts an assembly where solder 18 between adjacent solder pads bulges horizontally to the point of forming an electrical contact between adjacent connection sites. This can occur, for example, when too much force is applied during chip join, when a substrate is warped, or when excess solder is used. This can result in an electrical short in the finished circuit during operation and can render the circuit inoperative. FIG. 1C is a side view of a portion of a conventional substrate circuit depicting a conventional under-plated assembly. After melting and re-solidifying, missing metal can render the solder connections fragile to mechanical stress and fatigue and potentially susceptible to fractures and electrical opens, which can also render the circuit inoperative. FIG. 1D depicts an assembly with defects due to non-wetting. Non-wetting, including a contact nonwet where the solder touches both solder pads and non-contact nonwet where the solder only touches one solder pad, results when the solder fails to completely adhere to the adjacent pad and part of the solder pad remains exposed after cooling. Non-wetting can be caused by a variety of issues, including warpage, temperature variability, solder volume variability, and contamination. As scaling of such circuits continues, interconnect sensitivity to solder volume, warpage, applied forces, and similar issues will be increasingly problematic.

Figure 2:
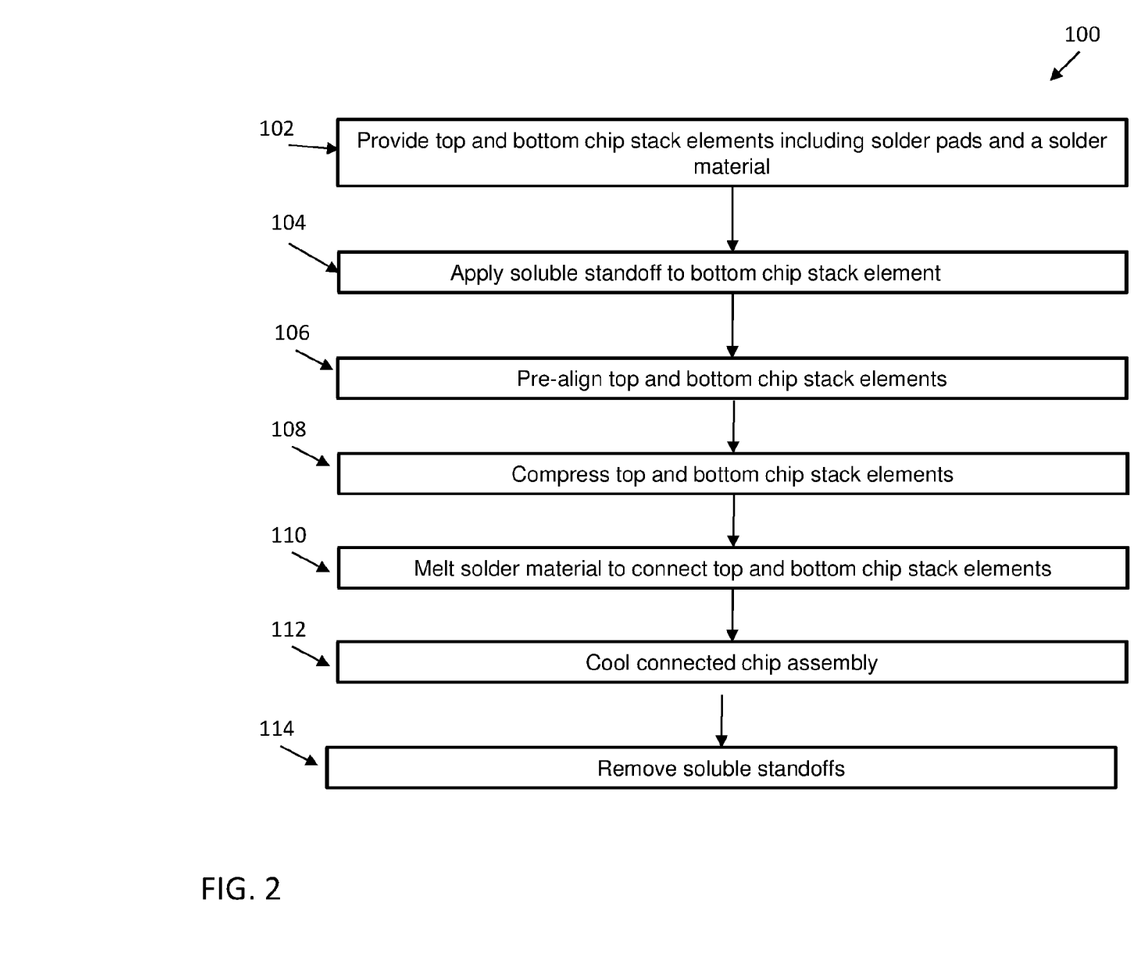
FIG. 2 is a flow diagram of a method of assembling a multi-chip system in accordance with an exemplary embodiment.

With reference now to FIG. 2, a flow diagram of a method 100 for assembling a multi-chip system in accordance with an exemplary embodiment is shown. As shown at block 102, the method 100 includes providing a top chip stack element including a top solder pad and a bottom chip stack element including a bottom solder pad. A solder material is provided on the top solder pad, the bottom solder pad or both of the top and bottom solder pads.

Next, as shown at block 104, soluble standoff is applied to the bottom chip stack element. In accordance with the disclosure, the top and bottom chip stack elements are pre-aligned. In some embodiments, the top and bottom chip stack elements are pre-aligned after applying soluble standoff to the bottom chip stack element. In other embodiments, the top and bottom chip stack elements are pre-aligned before applying soluble standoff to the bottom chip stack element.

Next, as shown at block 108, the top and bottom chip stack elements are compressed. For example, in some embodiments, a force is applied to the top or the bottom chip stack element to move the chip stack elements in closer proximity to one another and to ensure sufficient contact during solder material melting and cooling. During compression, the soluble standoffs can provide mechanical support to prevent over-compression of the solder material during melting and to allow a uniform height of the solder material and top chip stack element after chip assembly. This could also be of interest for mixed pitch, and often different diameter, solder connections where there is a tendency for the larger solder connections to exert a large suspending force that keeps smaller solder contacts apart allowing opens to form.

The method then includes, as shown at block 110, melting the solder material to connect the top and bottom chip stack elements. Next, as shown at block 112, the chip assembly is cooled to solidify the solder material. Then, as shown at block 114, the method 100 includes removing the soluble standoffs.

In accordance with the disclosure, the top chip stack element or the bottom chip stack element can contain any materials that can be used in an optoelectronic, a microelectronic, or a micro-mechanic single or multi-chip system. For example, but not by way of limitation, the chip stack elements can contain a ceramic material, such as sintered glass, a non-conductive organic material, or a semiconductor material, including for instance silicon, germanium, gallium, arsenide, indium phosphide, or glass.

In accordance with the disclosure, solder pads include any surface providing a contact area for a solder material useful in multi-chip assemblies. For example, solder pads include metal pads or pillars formed of one or more thin metal films such as titanium, nickel, copper, platinum, gold, and combinations thereof.

In accordance with the disclosure, a solder material is deposited onto one or more solder pads to make plated solder pads. Solder material can be any solder material used for chip assembly, such as tin, silver, gold, bismuth, indium, lead or a combination thereof including tin-silver or lead-tin. In accordance with the disclosure, solder material can be deposited prior to chip assembly on a top chip stack element, on a bottom chip stack element or both. It can also be deposited on the substrate along with or on top of the substrate pad. In some embodiments, the solder material is deposited prior to chip assembly on the bottom solder pad. In some embodiments, the solder material is deposited prior to chip assembly on the top solder pad.

A soluble standoff in accordance with the disclosure is a material that can provide mechanical support to a chip stack element during chip joining and that is soluble in a solvent. The soluble standoff should have a melting temperature greater than the melting temperature of the solder. For example, the soluble standoff can have a melting temperature greater than or equal to 280° C., or 400° C., or 800° C., or 1000° C., or 1200° C.

In some embodiments, the soluble standoff is a selectively soluble material, such that it is soluble in one or more aqueous solvents, for example, but not in a solder flux material. In preferred embodiments, a soluble standoff is soluble in water but not soluble in flux. In some embodiments, the soluble standoff comprises a salt. In some embodiments, the soluble standoff consists essentially of a salt. In some embodiments, the soluble standoff comprises a chloride salt or a sulfate salt. For example, the soluble standoff can include a chloride salt, such as sodium chloride or iron chloride, or a sulfate salt, such as magnesium sulfate or sodium sulfate.

In some embodiments, soluble standoff material can be mixed with flux material. For example, soluble standoff can be mixed with a flux material and then be applied as a mixture to the bottom chip stack element. In some embodiments, a flux material can be applied to a bottom chip stack element and soluble standoff can then be applied to the flux material.

In some embodiments, the first chip stack element and the second chip stack element are pre-aligned to bring the top solder pad in proximity to the bottom solder pad. For example, in a conventional flip-chip bonding process a pick and place tool may be used to place a chip face down on a substrate, where the chip contains solder balls on about 200 micron pitch, for example, controlled collapse chip connections (C4s), and the chip contains matching solder pads. The combination can be passed through an oven, such as a reflow furnace, to join the chip to the substrate by melting the solder.

In some embodiments, the pre-melt chip assembly is compressed to provide a force to a chip stack element. For example, in some embodiments, a force 222, such as a weight, is applied to the top chip stack element 210. When a force 222 is applied to a chip stack element, soluble standoffs can provide mechanical support to prevent over-compression of solder that could otherwise lead to bulging of the solder in the horizontal direction and potential electrical shorts. Providing a force to the chip stack element can correct warpage of a chip stack element and bring top and bottom solder pads into closer proximity with one another than would be possible without the applied force.

After a solder material is melted and resolidified, in some embodiments, the method includes removing the soluble standoffs. Soluble standoffs can be removed, in some embodiments, by exposing the soluble standoffs to a solvent for a time sufficient to dissolve a portion of the soluble standoff such that the soluble standoff shrinks enough to be removed with a force due to air, liquid flow, or the like. For example, a soluble standoff can be reduced in size with a solvent, and swept away with fluid during a washing step. In some embodiments, the soluble standoff can be completely dissolved in a solvent and then the chip-assembly optionally can be rinsed and dried. In some embodiments, the chip assembly can be subjected to multiple wash cycles in a wash tool. In some embodiments, successive washing can result in removal of greater than 75% of the soluble standoff material, such as greater than 80% or greater than 90% or greater than 95% or 100% removal of the soluble standoff material.

In some embodiments, a polymeric underfill is included in between the one or more chip stack elements to provide better thermo-mechanical reliability. The underfill could be a thermally cured epoxy or silicone, for example, or any other polymeric material. Preferably, the underfill is an epoxy compound.

Figure 3A:
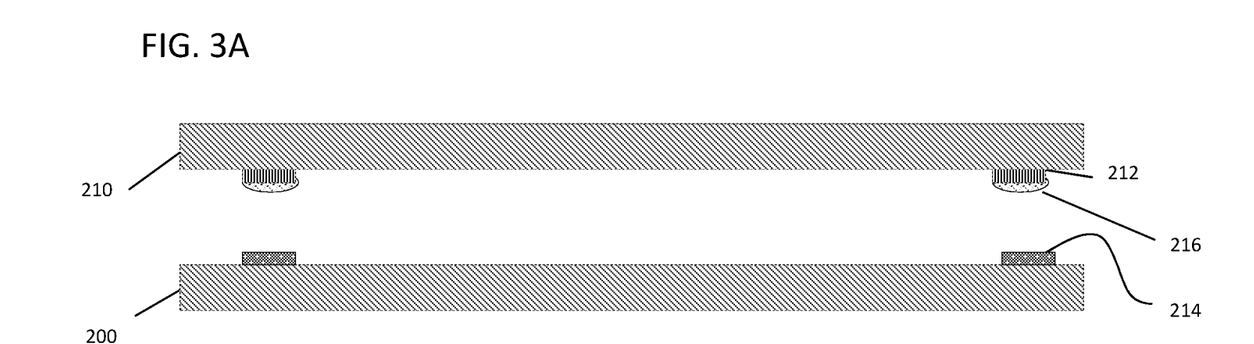
FIG. 3A illustrates a side view of a portion of a top and bottom chip stack element.
Figure 3B:
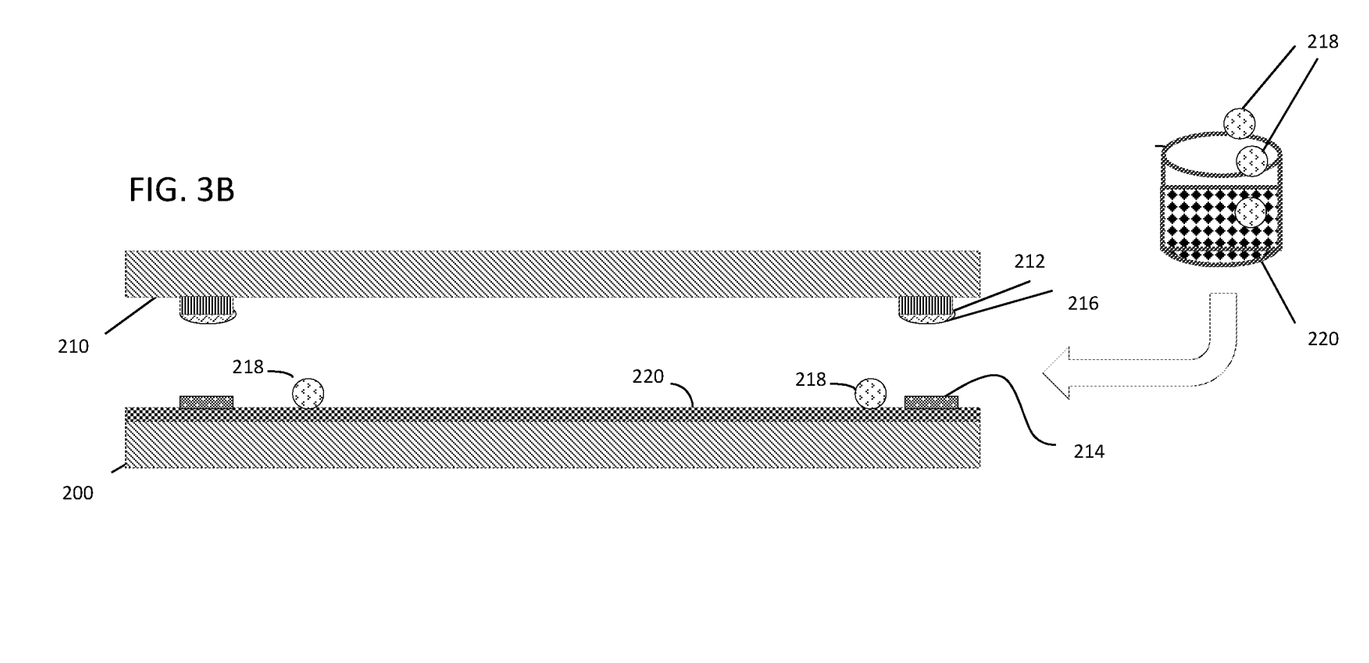
FIG. 3B illustrates a side view of the top and bottom chip stack element after soluble standoff is applied to the bottom chip stack element.
Figure 3C:
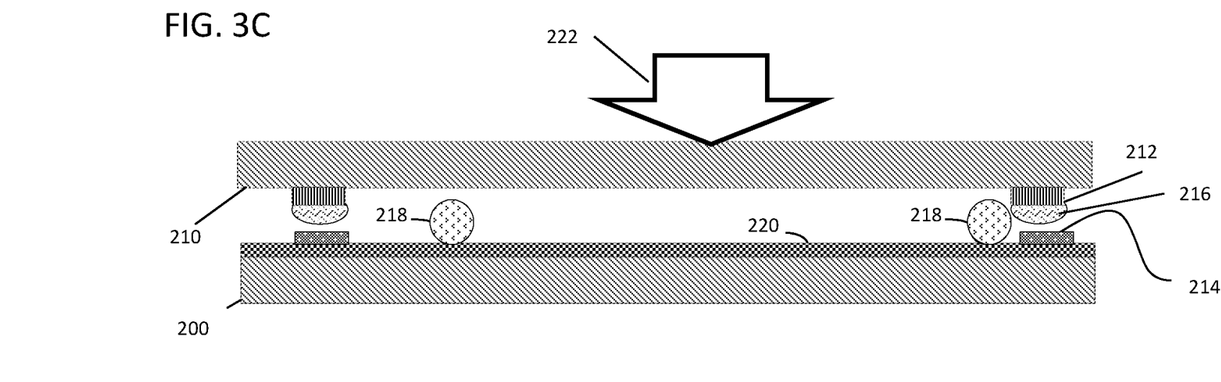
FIG. 3C illustrates a side view after chip pre-alignment.
Figure 3D:
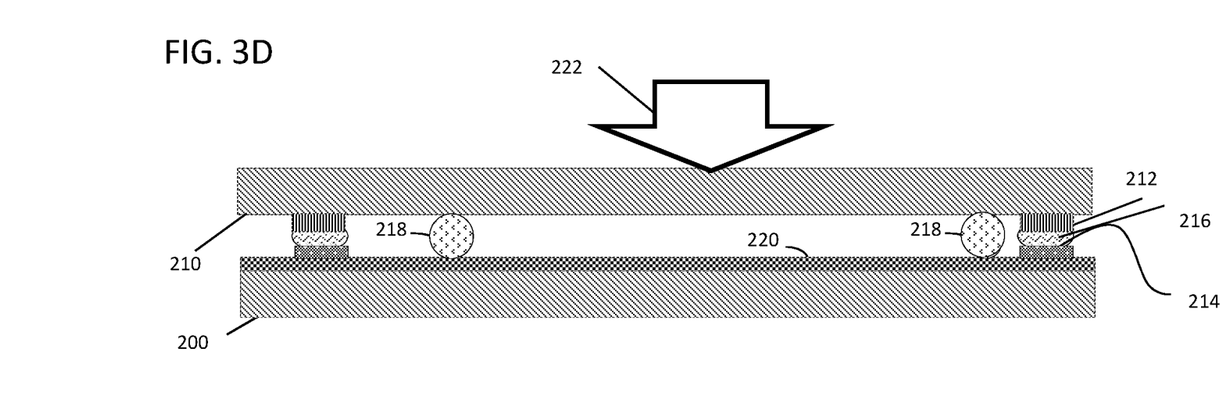
FIG. 3D illustrates a side view after a force is applied to the top chip stack element.

FIGS. 3A-3F illustrates a method of assembling a multi-chip system according to an exemplary embodiment. As shown in FIG. 3A, a bottom chip stack element 200 includes a bottom solder pad 214 and a top chip stack element 210 includes a top solder pad 212 and a solder material 216. Next, as illustrated in FIG. 3B, soluble standoff composed of sodium chloride 218 is mixed in a flux material 220 and applied to the bottom chip stack element 200. Then, as illustrated in FIG. 3C, the top chip stack element 210 and bottom chip stack element 200 are pre-aligned to bring the top solder pad 212 in proximity to the bottom solder pad 214. A force 222 can be positioned above the top chip stack element. Flux material 220 can tack the assembly and hold the soluble standoffs in place.

As depicted in FIG. 3D, the downward force 222 on the chip assembly, brings the solder material 216 from the top solder pad 212 into contact with the bottom solder pad 214. Soluble standoffs 218 provide mechanical support to the top chip stack element 210 and prevent over compressing the solder material 216. The soluble standoffs can be selected to be of a predetermined size or size range, for example, to provide a fixed height across the chip assembly.

Figure 3E:
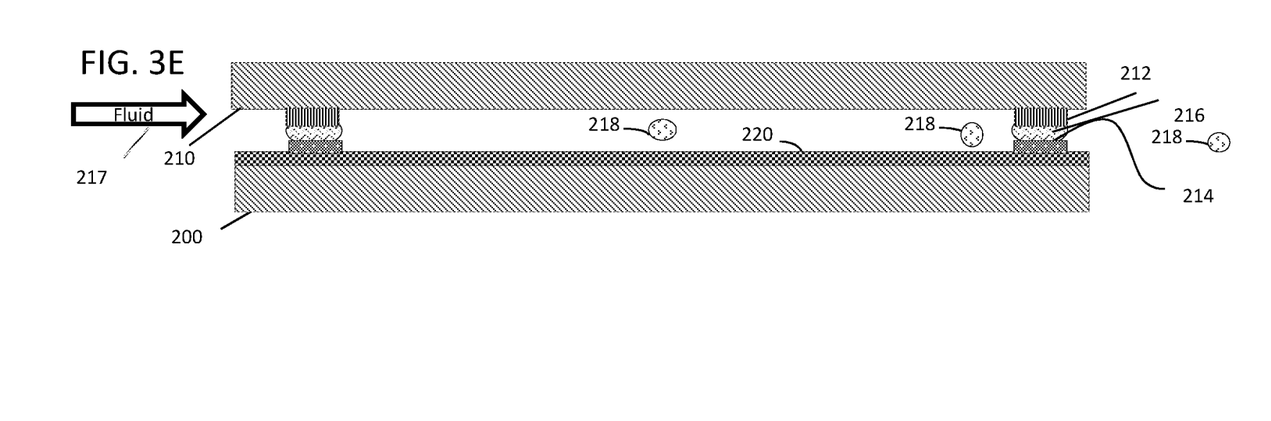
FIG. 3E illustrates a side view wherein cleaning fluid is applied to remove the soluble standoffs.

After the solder material is melted and resolidified to form a connection, as shown in FIG. 3E, cleaning fluid 217 can be applied to the chip assembly. The cleaning fluid is a solvent for the soluble standoffs 218, which dissolve and shrink in diameter and then can be removed with the flow of fluid. For example, water can dissolve the sodium chloride and facilitate its removal from the chip assembly.

Figure 3F:
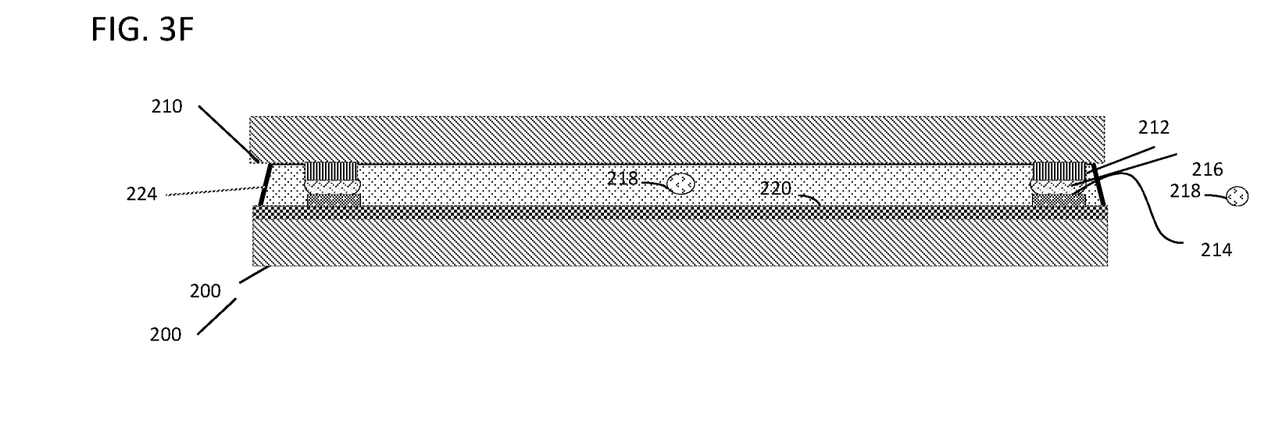
FIG. 3F illustrates a side view after underfilling the connected chip assembly.

As illustrated in FIG. 3F, an underfill material 224 can be applied to the chip assembly. The underfill 224 can infiltrate the gap between the top and bottom chip stack elements and can then be cured. Underfill 224 can protect solder joins and interconnections.

The soluble standoffs can be selected to be a size useful for a given chip assembly. For example, the soluble standoffs can be selected to have a maximum diameter of 400 µm, 200 µm, 150 µm, 100 µm, 60 µm or 50 µm. The size should be chosen to create the desired standoff distance across the two joined surfaces.

Figure 4A:
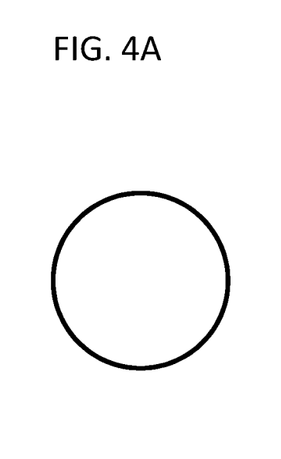
FIG. 4A illustrates a spherical soluble standoff of uniform composition.
Figure 4B:
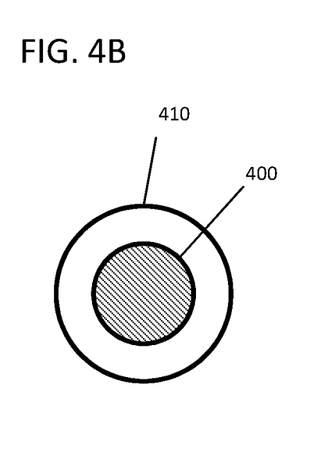
FIG. 4B depicts a spherical soluble standoff containing a metal core.
Figure 4C:
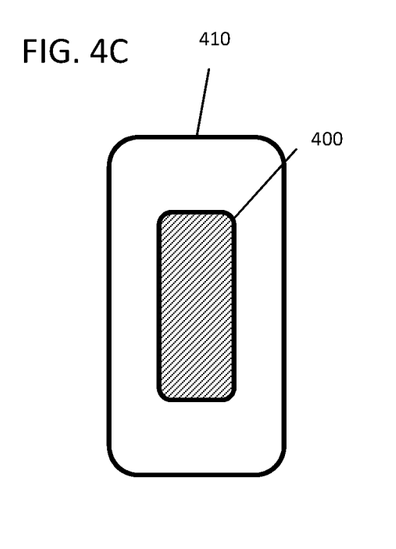
FIG. 4C depicts a non-spherical soluble standoff containing a metal core.

As illustrated in FIG. 4, soluble standoff can have a variety of shapes and can include one or more materials. For example, in some embodiments, as shown in FIGS. 4A-4B soluble standoff is spherical. In some embodiments, soluble standoff is non-spherical as exemplified in FIG. 4C. In some embodiments, soluble standoff is homogeneous, as shown in FIG. 4A. In some embodiments, soluble standoff is heterogeneous as depicted in FIG. 4B-4C. For example, in some embodiments, soluble standoff is a composite coated particle including a metal core 400 and a soluble outer shell 410. The metal core can include, for example, a magnetic material such as iron or an iron based material. In some embodiments, the metal core includes aluminum.

The insoluble standoffs with a soluble coating surface allows for creating larger standoffs than might otherwise be available with homogeneous standoff materials. For instance, during the wash cycle only the soluble coating needs to be removed to reduce the size of the standoff so that it can be removed from the gap between the surfaces.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of assembling a chip system, comprising:
   providing a top chip stack element having two major surfaces, the top chip stack element comprising a top solder pad on a plane of a first top surface;
   providing a bottom chip stack element having two major surfaces, the bottom chip stack element comprising a bottom solder pad on a plane of a first bottom surface;
   providing a solder material on one or more of the top solder pad and the bottom solder pad;
   applying spherical soluble standoffs to the plane of the first bottom surface, wherein the spherical soluble standoff is a salt;
   pre-aligning the first chip stack element and the second chip stack element to bring the top solder pad in proximity to the bottom solder pad to form a pre-melt chip assembly;
   raising the temperature to a temperature above the melting temperature of the solder material to form a connected chip assembly;
   cooling the connected chip assembly to re-solidify the solder material; and
   removing the spherical soluble standoffs from the connected chip assembly.

2. The method of claim 1, further comprising applying a force to the top chip stack element before raising the temperature to a temperature above the melting temperature of the solder material.

3. The method of claim 2, comprising conducting thermo-compression bonding.

4. The method of claim 1, further comprising after removing the soluble standoffs from the connected chip assembly, under filling the connected chip assembly.

5. The method of claim 1, wherein the soluble standoffs are dispersed in a flux material before applying the spherical soluble standoffs to the plane of the first bottom surface.

6. The method of claim 1, wherein removing the spherical soluble standoffs comprises washing the connected chip assembly with a solvent.

7. The method of claim 6, wherein the solvent is water.

8. The method of claim 1, wherein the salt has a melting temperature greater than or equal to 280° C.

9. The method of claim 8, wherein the salt has a melting temperature greater than or equal to 400° C.

10. The method of claim 1, wherein the salt is a chloride salt or a sulfate salt.

11. The method of claim 10, wherein the salt is sodium chloride, magnesium sulfate, or sodium sulfate.

12. The method of claim 1, wherein the soluble standoff is a composite coated particle comprising a metal core.

13. The method of claim 12, wherein the composite coated particle comprises a salt surrounding the metal core.

14. A method of assembling a chip system, comprising:
   providing a top chip stack element having a top solder pad on a plane of a first top surface;
   providing a bottom chip stack element having a bottom solder pad on a plane of a first bottom surface;

providing a solder material on one or more of the top solder pad and the bottom solder pad;

applying composite coated particles to the plane of the first bottom surface, the composite coated particles comprising a metal core;

pre-aligning the first chip stack element and the second chip stack element to bring the first solder pad in proximity to the plated solder pad forming a pre-melt chip assembly;

compressing the pre-melt chip assembly with a force;

forming a connected chip assembly;

re-solidifying the solder material; and removing the composite coated particles from the connected chip assembly.

15. The method according to claim 14, comprising moving the composite coated particles with a magnetic force.

16. The method according to claim 15, wherein removing the composite coated particles from the connected chip assembly comprises moving the composite coated particles off of the connected chip assembly with the magnetic force.

17. A chip assembly, comprising
a top chip stack element having two major surfaces, the top chip stack element comprising a top solder pad on a plane of a first top surface;
a bottom chip stack element having two major surfaces, the bottom chip stack element comprising a bottom solder pad on a plane of a first bottom surface;
a solder material; and
a composition comprising a flux material and a soluble standoff.

18. The chip assembly according to claim 17, wherein the soluble standoff is a composite coated particle comprising a metal core.

19. The chip assembly according to claim 18, wherein the metal core comprises iron.

* * * * *